(12) United States Patent
Berry et al.

(10) Patent No.: US 12,520,652 B2
(45) Date of Patent: Jan. 6, 2026

(54) MULTILAYER BACK CONTACTS FOR PEROVSKITE PHOTOVOLTAIC DEVICES

(71) Applicants: First Solar, Inc., Tempe, AZ (US); Alliance for Sustainable Energy, LLC, Golden, CO (US)

(72) Inventors: Joseph Jonathan Berry, Boulder, CO (US); Le Chen, Fremont, CA (US); Axel Finn Palmstrom, Golden, CO (US); Tze-Bin Song, Fremont, CA (US); Vera Steinmann, Menlo Park, CA (US); Natasha Teran, San Leandro, CA (US); Aravamuthan Varadarajan, Fremont, CA (US); Xueping Yi, San Jose, CA (US); Zhibo Zhao, Novi, MI (US); Kai Zhu, Littleton, CO (US)

(73) Assignees: First Solar, Inc., Tempe, AZ (US); Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 18/277,157

(22) PCT Filed: Feb. 11, 2022

(86) PCT No.: PCT/US2022/016145
§ 371 (c)(1),
(2) Date: Aug. 14, 2023

(87) PCT Pub. No.: WO2022/174055
PCT Pub. Date: Aug. 18, 2022

(65) Prior Publication Data
US 2024/0138164 A1    Apr. 25, 2024
US 2024/0237371 A9    Jul. 11, 2024

Related U.S. Application Data

(60) Provisional application No. 63/149,060, filed on Feb. 12, 2021.

(51) Int. Cl.
*H10K 30/81*    (2023.01)
*H10K 30/40*    (2023.01)
(Continued)

(52) U.S. Cl.
CPC ............. *H10K 30/81* (2023.02); *H10K 30/40* (2023.02); *H10K 30/86* (2023.02); *H10K 30/89* (2023.02);
(Continued)

(58) Field of Classification Search
CPC ........ H10K 30/10; H10K 30/40; H10K 30/50; H10K 30/81; H10K 30/86; H10K 30/88; H10K 30/89; H10K 71/60; H10K 85/50
See application file for complete search history.

(56) References Cited

U.S. PATENT DOCUMENTS 9,147,778 B2    9/2015   Zafar et al.
10,879,479 B2   12/2020  Hammond et al.
(Continued)

FOREIGN PATENT DOCUMENTS

CN    110165061 A  *  8/2019  .......... H01L 51/0001
CN    210156403 U     3/2020
(Continued)

OTHER PUBLICATIONS

CN 110165061 A English translation provided by Patent Translated: Powered by EPO and Google, translated on Dec. 13, 2024.*
(Continued)

*Primary Examiner* — Golam Mowla
(74) *Attorney, Agent, or Firm* — MacMillan, Sobanski & Todd, LLC

(57) ABSTRACT

Photovoltaic devices having contact layers are described herein. Devices, intermediate structures, and methods for
(Continued)

making multilayer contacts for perovskite photovoltaic devices are provided. Embodiments include back contacts for N-I-P structures.

16 Claims, 8 Drawing Sheets

(51) Int. Cl.
*H10K 30/50* (2023.01)
*H10K 30/86* (2023.01)
*H10K 30/89* (2023.01)
*H10K 71/60* (2023.01)
*H10K 85/50* (2023.01)

(52) U.S. Cl.
CPC ............ *H10K 71/60* (2023.02); *H10K 85/50* (2023.02); *H10K 30/50* (2023.02)

(56) References Cited

U.S. PATENT DOCUMENTS

| | | | |
|---|---|---|---|
| 11,417,785 B2 | 8/2022 | Liang et al. | |
| 11,462,688 B2 | 10/2022 | Palmstrom et al. | |
| 2004/0144419 A1* | 7/2004 | Fix | H10F 77/211 |
| | | | 257/E31.007 |
| 2005/0202589 A1* | 9/2005 | Basol | H01L 21/02628 |
| | | | 438/102 |
| 2010/0102450 A1* | 4/2010 | Narayan | H10K 30/82 |
| | | | 427/126.6 |
| 2013/0019937 A1* | 1/2013 | So | H10K 30/82 |
| | | | 257/E31.026 |
| 2014/0004651 A1* | 1/2014 | Fogel | H10F 77/1692 |
| | | | 257/E31.124 |
| 2015/0325719 A1* | 11/2015 | Wijdekop | H10F 77/244 |
| | | | 438/98 |
| 2015/0340632 A1* | 11/2015 | Etgar | H10K 85/50 |
| | | | 438/93 |
| 2018/0294315 A1* | 10/2018 | Shiomi | H10K 30/81 |
| 2019/0148571 A1* | 5/2019 | Jayamaha | H10F 10/167 |
| | | | 438/94 |
| 2020/0381568 A1 | 12/2020 | Lifka et al. | |
| 2022/0102567 A1 | 3/2022 | Jin et al. | |

FOREIGN PATENT DOCUMENTS

| | | |
|---|---|---|
| EP | 3422430 A1 | 1/2019 |
| WO | 2022174049 A1 | 8/2022 |

OTHER PUBLICATIONS

PCT International Preliminary Report on Patentability, dated Aug. 15, 2023, Application No. PCT/US2022/016145.
PCT International Search Report and Written Opinion, dated Jul. 19, 2022, Application No. PCT/US2022/016145.
Fu et al., "Room-temperature sol-gel derived molybdenum oxide thin films for efficient and stable solution-processed organic light-emitting diodes," ACS Appl. Mater. Interfaces, 2013, vol. 5, Issue 13, pp. 6024-6029. Abstract Only.
Shalan et al., "Cobalt Oxide (CoOx) as an Efficient Hole-Extracting Layer for High-Performance Inverted Planar Perovskite Solar Cells," ACS Appl. Mater. Interfaces, 2016, vol. 8, pp. 33592-33600.
Bullock et al., "Molybdenum oxide MoOx: A versatile hole contact for silicon solar cells," Applied Physics Letters, vol. 105, pp. 232109-1-232109-5.
Leijtens et al., "Opportunities and challenges for tandem solar cells using metal halide perovskite semiconductors," Review Article, Nature Energy, https://doi.org/10.1038/s41560-018-0190-4, pp. 1-11.
Yi et al., "Aqueous Solution-Deposited Molybdenum Oxide Films as an Anode Interfacial Layer for Organic Solar Cells," ACS Applied Mater. Interfaces, 2015, vol. 7, pp. 18218-18224.
Boyd et al., "Understanding Degradation Mechanisms and Improving Stability of Perovskite Photovoltaics," ACS Publications, American Chemical Society, pp. 1-34.
Ali et al., "Prospects of e-beam evaporated molybdenum oxide as a hole transport layer for perovskite solar cells," Journal of Applied Physics, 2017, vol. 122, pp. 123105-123105-9.
Kaltenbrunner et al., "Flexible high power-per-weight perovskite solar cells with chromium oxide-metal contacts for improved stability in air," Nature Materials, 2015, pp. 1-10.
Sanehira et al., "Influence of Electrode Interfaces on the Stability of Perovskite Solar Cells: Reduced Degradation Using MoOx / Al for Hole Collection," ACS Publications, 2016, https://doi.org/10.1021/acsenergylett.6b00013.
Dong et al., "Improvement of the humidity stability of organic/inorganic perovskite solar cells using ultrathin Al2O3 layers prepared by atomic layer deposition," Journal of Materials Chemistry A, 2015, vol. 3, No. 10, pp. 5360-5367.
European Communication pursuant to Article 94(3) EPC, dated Feb. 5, 2024, Application No. 22 706 206.4.

\* cited by examiner

MULTILAYER BACK CONTACTS FOR PEROVSKITE PHOTOVOLTAIC DEVICES

CROSS-REFERENCE TO RELATED APPLICATIONS

This is a national phase application of international application PCT/US2022/016145, filed on Feb. 11, 2022, and claims the benefit of U.S. Provisional Application No. 63/149,060, filed on Feb. 12, 2021, each of which is incorporated by reference in the entirety.

STATEMENT REGARDING FEDERALLY SPONSORED RESEARCH

This invention was made under a Cooperative Research and Development Agreement, CRADA #CRD-13-507, between First Solar, Inc. and The National Renewable Energy Laboratory, operated for the United States Department of Energy. The United States Government has rights in this disclosure under Contract No. DE-AC36-08GO28308 between the United States Department of Energy and Alliance for Sustainable Energy, LLC, the Manager and Operator of the National Renewable Energy Laboratory. The government has certain rights in this invention.

BACKGROUND

The present specification generally relates to layers for photovoltaic devices and, more specifically, to the use of particular combinations of materials, layer structures, and layer formation parameters to provide efficient back contacts for use in N-I-P structured perovskite photovoltaic devices.

A photovoltaic device generates electrical power by converting light into electricity using semiconductor materials that exhibit the photovoltaic effect. Perovskites are a class of materials which may form an active layer in photovoltaic devices. Perovskite compounds have an $ABX_3$ structure, where A and B are cations and X is a halide. Materials including lead halide and tin halide perovskite compounds have been studied for use in photovoltaic devices. In these structures, the A site may be composed of one or more cations, such as methylammonium (MA), formamidinium (FA), cesium ($Cs^+$), or rubidium ($Rb^+$). The B site may be occupied, for example, by one or more of lead ($Pb^{+2}$), tin ($Sn^{+2}$), or germanium ($Ge^{+2}$) cations. And the X site may be occupied by one or more halogen anions, such as iodine ($I^-$), bromine (Br), or chlorine ($Cl^-$). In a photovoltaic device, the perovskite material is positioned in contact with and between an electron charge transport layer (ETL) and hole charge transport layer (HTL).

Perovskite solar cells can degrade when exposed to moisture, oxygen, heat, light, mechanical stress, and reverse bias. Heat can volatilize halide species from the perovskite complex, and light exposure can enhance halogen mobility, promoting reactions with metal contacts. Most metals are susceptible to react with halogens or halide species, potentially causing corrosion, instability, or diminished efficiency.

Existing back contacts or conductive layers applied over hole-transport layers in metal-halide perovskite solar cells include materials such as silver (Ag) and gold (Au), which are expensive and contribute to instability. Alternate materials, such as alloys of aluminum (Al) and copper (Cu) also have significant stability issues. Perovskite semiconductor materials and materials used for hole transport layers can be damaged by high-temperature processing steps, constraining options for the materials and deposition methods for use in producing perovskite-based photovoltaic devices.

Accordingly, a need exists for alternative layer structures, compositions, and processing methods to provide efficient back contacts in perovskite photovoltaic devices.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, wherein like reference numerals designate identical or corresponding parts throughout the views.

DETAILED DESCRIPTION

Figure 1:
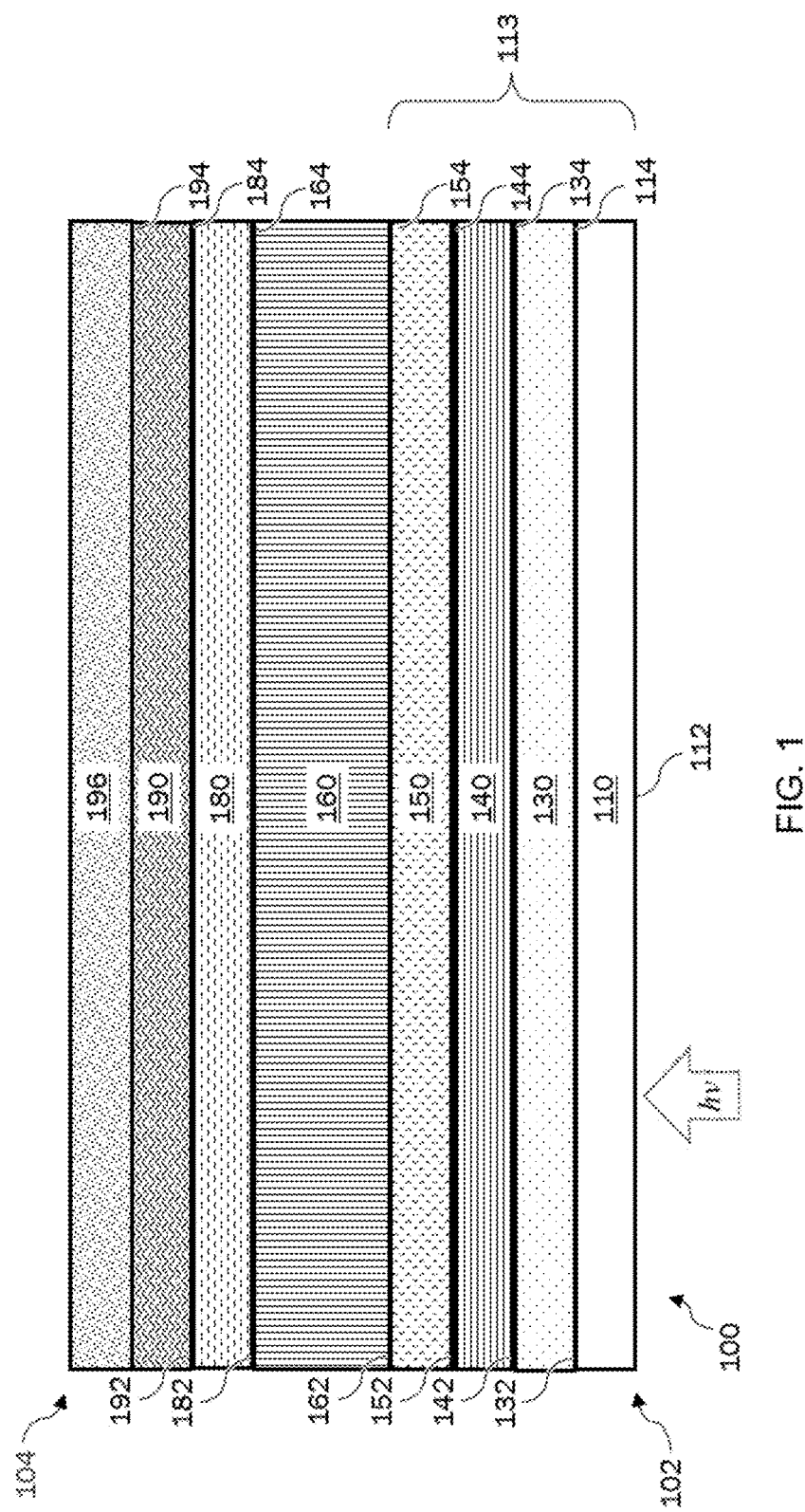
FIG. 1 schematically depicts a cross-sectional view of a segment of a photovoltaic device according to one or more embodiments shown and described herein.

It has been found that selected materials can be combined into a multilayer back contact structure that improves reliability and facilitates use of a broader range of processing methods. Specifically, the combination of a very thin layer, nearly a monolayer, of a conductive buffer sublayer, overlaid by a very thin conductive barrier sublayer, and electrically contacting a conductive sublayer, overlaid by a protective conductive layer, produced a device with superior stability and functionality. It was further discovered that the use of the conductive buffer sublayer, even an extremely thin buffer sublayer, over a thermally sensitive layer, such as a perovskite or an organic HTL material, protected that material, thereby facilitating the subsequent use of moderately high-temperature deposition steps, such as sputtering. The device produced by the method was resistant to degradation from moisture, ion redistribution, chemical recombination, and halide-metal reactions. Additionally, embodiments of the device may achieve desired efficiency using affordable and lighter materials, using less material overall, forming a thinner back contact, and reducing weight.

Embodiments provide a multilayer back contact for an N-I-P structured perovskite photovoltaic device and methods of forming the multilayer back contact and the device. Generally, the photovoltaic devices provided herein can include partly-formed or fully-formed photovoltaic modules. Various embodiments of the multilayer back contact, the partly-formed photovoltaic structure, and the photovoltaic device, as well as systems and methods for forming the layers, structures, and devices, will be described in more detail herein.

Perovskite-based photovoltaic devices can be formed from a stack of functional layers formed over a substrate. The devices can include an absorber layer for converting light into charge carriers, and conductive layers for collecting the charge carriers. As charge carriers are generated, an electric potential is produced by the separation of charges. The positive and negative charge carriers, holes and electrons respectively, move in opposite directions, propagating towards electrodes and through p-type and n-type regions on opposite sides of the absorber. Perovskite-based photovoltaic devices are highly susceptible to degradation from moisture and may be damaged by high temperatures.

In an N-I-P structured device, the positively-charged holes are directed towards an electrode, or back electrical contact, opposite to the light-incident side of the device. Back contacts maybe formed from a metal layer, such as gold (Au) or silver (Ag). Metal contacts, like Au and Ag, are widely used for perovskite devices, however, those metals contribute to perovskite device instability. Ions can interdiffuse between the back contact and the absorber and react to form undesirable defects and corrosion. Halide ions or volatile halogen species formed from decomposition products of the perovskite material may diffuse to the metal electrode to corrode the metal. Some metals can form redox couples with metal cations from the perovskite material. Through these processes, metal contacts can contribute to device instability. In contrast, the multilayer back contact produces a device with good stability and efficiency.

Perovskite compounds have an $ABX_3$ structure, where A and B are cations and X is a halogen anion. Specific materials and compounds have been studied for use in photovoltaic devices. In example perovskite structures, the A site may be occupied by one or more of MA, FA, Cs, or Rb. The B site may be occupied by one or more of Pb, Sn, Ge, or other group 14 element. And the X site may be occupied by I, Br, or Cl.

Organic-inorganic or inorganic metal halide perovskite materials can be used to absorb light energy in photovoltaic devices. In a photovoltaic device, the perovskite material is positioned in contact with and between an electron charge transport layer (ETL) and a hole charge transport layer (HTL). Perovskite photovoltaic devices may be configured in either a N-I-P or P-I-N orientation, with either the electron or hole charge transport layer towards the light-incident side of the device.

FIG. 1 shows an example device structure for a perovskite photovoltaic device 100. In the example device 100 shown, the electron charge transport layer is proximate the light-incident side, showing an N-I-P structure.

A photovoltaic device 100 can be configured to receive light and transform light into electrical signals, e.g., photons can be absorbed from the light and transformed into electrical signals via the photovoltaic effect. Accordingly, the photovoltaic device 100, 200 can define an energy, light-incident, or front side 102 configured to be exposed to a light source such as, for example, the sun. The photovoltaic device can also define an opposing side 104 offset from the light-incident side 102 such as, for example, by a plurality of material layers. It is noted that the term "light" can refer to various wavelengths of the electromagnetic spectrum such as, but not limited to, wavelengths in the ultraviolet (UV), infrared (IR), and visible portions of the electromagnetic spectrum. "Sunlight," as used herein, refers to light emitted by the sun.

The photovoltaic device 100 can include a plurality of layers disposed between the light-incident front side 102 and the opposing side 104. As used herein, the term "layer" refers to a thickness of material provided upon a surface. Each layer can cover all or a portion of the surface. A layer may have sublayers. A layer may have a compositional gradient within the layer across its thickness. The "thickness" of a layer, as used herein, generally describes a measurement across the layer and substantially perpendicular to a planar surface of the light-incident front side 102. A composition having an average atomic percent of an element in the layer, provides a value is representative of the entirety of the layer, however an atomic percentage at a particular location within the layer can be graded through the thickness compared to the overall composition of the layer.

The phrase "adjacent to," as used herein, means that two layers are disposed contiguously and without any intervening materials between all, or at least a portion of, the layers. In some instances, a transition zone, or regeion of interdifusion, may be formed at the junction of adjacent layers. As used herein, with respect to layer position, the term "over" or "on" describes a fixed relationship between layers, specifying the relative position. The terms "over" or "on," may describe "adjacent" layers, or may more broadly encompass a structure having one or more intermediate layers between the specified layers. As used herein, the terms "over" and "on" are generally used as oriented for forming a superstrate structure, in which, for example, the opposing side 104 would be over the light-incident front side 102. It will be understood that the orientation of a substrate structure is reversed with respect to a superstrate structure. Positional references are made for ease of explanation and to describe relative position. Such terms do not specify positional relationships to a deployed photovoltaic module or to any external environment unless explicitly stated.

In some embodiments, the layers of the photovoltaic device can be divided to form a plurality of photovoltaic cells. For example, the photovoltaic device can be scribed according to a plurality of serial scribes and a plurality of parallel scribes.

The layers of the photovoltaic device 100 can include a substrate 110 configured to facilitate the transmission of light into the photovoltaic device 100. The substrate 110 can be disposed at the front side 102 of the photovoltaic device 100. The substrate 110 can have a first surface 112 substantially facing the energy side 102 of the photovoltaic device 100 and a second surface 114 substantially facing the opposing side 104 of the photovoltaic device 100. One or more layers of material can be disposed between the first surface 112 and the second surface 114 of the substrate 110.

The substrate 110 can be substantially transparent. In some embodiments, the substrate comprises a substantially transparent material such as, for example, glass. Suitable glass can include soda-lime glass, a glass with reduced iron content, or a glass with about 90% transmittance. Optionally, the substrate 110 can include a performance coating applied to form the exterior or light-facing surface. The performance coating can be configured to interact with light or to improve durability of the substrate 110 such as, but not limited to, an antireflective coating, an antisoiling coating, or a combination thereof.

The photovoltaic device 100 can optionally include a barrier layer 130 configured to mitigate diffusion of contaminants from the substrate 110, which could result in degradation or delamination. The barrier layer 130 can have a first surface 132 substantially facing the front side 102 of the photovoltaic device 100 and a second surface 134 substantially facing the opposing side 104 of the photovoltaic device 100. In some embodiments, the barrier layer 130 can be provided adjacent to the substrate 110. For example, the first surface 132 of the barrier layer 130 can be provided upon the second surface 114 of the substrate 100.

Generally, the barrier layer 130 can be substantially transparent, thermally stable, with a reduced number of pin holes and having high sodium-blocking capability, and good adhesive properties. Alternatively or additionally, the barrier layer 130 can be configured to apply color suppression to light. The barrier layer 130 can include one or more layers of suitable material, including, but not limited to, tin oxide, tin dioxide, silicon oxide, silicon dioxide, silicon nitride, or aluminum oxide. The material of the barrier layer 130 may include a dopant. The barrier layer 130 can have any suitable thickness bounded by the first surface 132 and the second surface 134, including, for example, more than about 100 Å in one embodiment, more than about 150 Å in another embodiment, or less than about 200 Å in a further embodiment.

The photovoltaic device 100 can include an electrode layer 140 configured to provide electrical contact to transport electrons, negative charge carriers, generated by the photovoltaic device 100. The electrode layer 140 may function as an anode. The electrode layer 140 can have a first surface 142 substantially facing the energy side 102 of the photovoltaic device 100 and a second surface 144 substantially facing the opposing side 104 of the photovoltaic device 100.

In an N-I-P structured device, the electrode layer 140 is substantially transparent and may be referred to as a front contact, transparent electrode layer, or transparent conductor (TC). In some devices with an N-I-P structure, the electrode layer 140 can be provided adjacent to the barrier layer 130 or adjacent to the substrate 110. The electrode layer 140 can be formed from one or more layers of an n-type semiconductor material. The electrode layer 140 may have a wide band gap. Specifically, the wide band gap can have a larger energy value compared to the energy of the photons of the light, which can mitigate undesired absorption of light. The electrode layer 140 may comprise a transparent conductive oxide (TCO). The electrode layer 140 can include one or more layers of suitable material, including, but not limited to, tin oxide, tin dioxide, indium tin oxide, or cadmium stannate, and the material may be doped.

The photovoltaic device 100 can include an electron transport layer (ETL) 150. The electron transport layer (ETL) may also be called a negative charge transport layer, an n-type contact, an e-selective contact, or an electron-selective layer. The ETL 150 can have a first surface 152 substantially facing the front side 102 of the photovoltaic device 100 and a second surface 154 substantially facing the opposing side 104 of the photovoltaic device. The ETL 150 may be positioned in contact with the transparent electrode layer 140. For example, in an N-I-P structure, the first surface 152 of the ETL 150 can be provided upon the second surface 144 of the transparent electrode layer 140. The ETL 150 may have any suitable thickness between the first surface 152 and the second surface 154, including, for example, more than about 2 nm in one embodiment, between about 10 nm and about 80 nm in another embodiment, or between about 15 nm and about 60 nm in a further embodiment.

A partly-formed N-I-P structured device, including a substrate 110, an ETL 150, and layers therebetween, may be referred to as a substrate stack 113. The layers comprising the substrate stack 113 are substantially transparent. Optionally, the substrate stack may include one or more additional layers, such as a buffer layer, a high resistance layer, or an antireflective layer. The photovoltaic device 100 can include a plurality of layers and, where layers are not specified as adjacent, the photovoltaic device may include intervening layers not depicted.

The photovoltaic device 100 includes an absorber layer 160 comprising a perovskite material configured to cooperate with adjacent layers to form an N-I-P junction within the photovoltaic device. Accordingly, absorbed photons of light can free electron-hole pairs and generate carrier flow, which can yield electrical power.

Lead halide and other metal halide perovskite compounds may be used in an absorber layer of a photovoltaic device. The metal halide perovskite compounds have an $ABX_3$ structure, where A and B are cations and X is a halogen anion. In examples, the A site may be occupied by one or more organic or inorganic cations. For example, the A site may be composed of one or more of: methylammonium (MA), formamidinium (FA), cesium (Cs), or rubidium (Rb) cations. The B site may be occupied by one or more metals, such as lead (Pb) or tin (Sb). And the X site may be occupied by one or more halides, such as iodine (I), bromine (Br), or chlorine (Cl). In a photovoltaic device, an absorber layer of perovskite material may be positioned in contact with and between a negative charge transport layer and positive charge transport layer.

The perovskite absorber layer may be formed by selecting and reacting one or more A-type cations or A-X-type compounds with one or more B-X compounds. Metal halide materials suitable for use as a B-X compound in forming a perovskite material for an absorber layer include iodides, bromides, and/or chlorides, in combination with a metal, alkali metal and/or combinations thereof. Metal halide materials suitable for use in a perovskite compound include, but are not limited to, lead iodide ($PbI_2$), cesium iodide (CsI), lead bromide ($PbBr_2$), cesium bromide (CsBr), cesium lead iodide ($CsPbI_3$), cesium tin iodide ($CsSnI_3$), lead chloride ($PbCl_2$), tin iodide ($SnI_2$), tin bromide ($SnBr_2$), and/or tin chloride ($SnCl_2$).

The absorber layer 160 can have a first surface 162 substantially facing the energy side 102 of the photovoltaic device 100 and a second surface 164 substantially facing the opposing side 104 of the photovoltaic device. A thickness of the absorber layer 160 can be defined between the first surface 162 and the second surface 164. In an example device, the thickness of the absorber layer 160 can be between about 0.2 μm to about 10 μm such as, for example, between about 1 μm to about 7 μm in one embodiment, or between about 1.5 μm to about 4 μm in another embodiment.

The photovoltaic device 100 can include a hole transport layer (HTL). The hole transport layer (HTL) 180 may also be called a positive charge transport layer, p-type contact, hole transport material, h+ selective contact, or a hole-selective layer. It may be positioned in contact with a conducting layer which functions as a cathode. The HTL 180 provides electrical contact to the absorber layer 160. The HTL 180 can have a first surface 182 substantially facing the front side 102 of the photovoltaic device 100 and a second surface 184 substantially facing the opposing side 104 of the photovoltaic device. A thickness of the HTL 180 can be defined between the first surface 182 and the second surface 184. The thickness of the HTL 180 can be between about 2 nm to about 200 nm, or, between about 2 nm to about 100 nm. In an N-I-P structure, the HTL 180 may be provided adjacent to the absorber layer 160 on the back side, such that the first surface 182 of the HTL 180 is provided upon the second surface 164 of the absorber layer 160.

In some embodiments, the HTL 180 is a polymer, a small molecule, or an inorganic compound. In some embodiments, the HTL 180 comprises a polymer material selected from Poly[bis(4-phenyl)(2,4,6-trimethylphenyl)amine] (PTAA), Poly(3-hexylthiophene-2,5-diyl) (P3HT), or Poly(3,4-ethylenedioxythiophene)-poly(styrenesulfonate) (PEDOT:PSS). In some embodiments, the HTL 180 comprises a small molecule selected from N2,N2,N2',N2',N7,N7,N7',N7'-octakis(4-methoxyphenyl)-9,9'-spirobi[9H-fluorene]-2,2',7,7'-tetramine (Spiro-OMeTAD), N2,N2,N2',N2',N7,N7,N7', N7'-octakis(4-methoxyphenyl)-10-phenyl-1 OH-spiro [acridine-9,9'-fluorene]-2,2',7,7'-tetraamine (SAF-OMe), OMeTPA-FA, SGT-407, Fused-F, or tetrathiafulvalene (TTF-1). In some embodiments the HTL 180 comprises a material selected from: alpha-NPD, 6,13-bis(triisopropylsilylethynyl) pentacene (TIPS-pentacene), PCPDTBT, PCDTBT, graphene oxide, and quinolizino acridine. In some embodiments the HTL comprises polyelectrolyte (P3CT-N, P3CT-Rb), spiro[fluorene-9,9'-xanthene] (SFX)-based 3D oligomers (X55). In some embodiments the HTL comprises a carbazole based self-assembled monolayer such as 2PACz, MeO-2PACz, or Me-4PACz. In some embodiments, the HTL 180 comprises an inorganic compound selected from nickel oxide (NiOx), cuprous thiocyanate (CuSCN), copper iodide (CuI), or copper oxide ($Cu_2O$).

The photovoltaic device 100 includes a p-type electrode, back contact, or conducting layer 190. The conducting layer 190 can have a first surface 192 substantially facing the energy side 102 of the photovoltaic device and a second surface 194 substantially facing the opposing side 104 of the photovoltaic device. In the N-I-P structured device shown in FIG. 1, the conducting layer 190 functions as a back electrode and is provided adjacent to the HTL 180 such that the first surface 192 of the conducting layer 190 contacts the second surface 184 of the HTL 180. In embodiments described, the conducting layer 190 comprises a plurality of sublayers.

Figure 2:
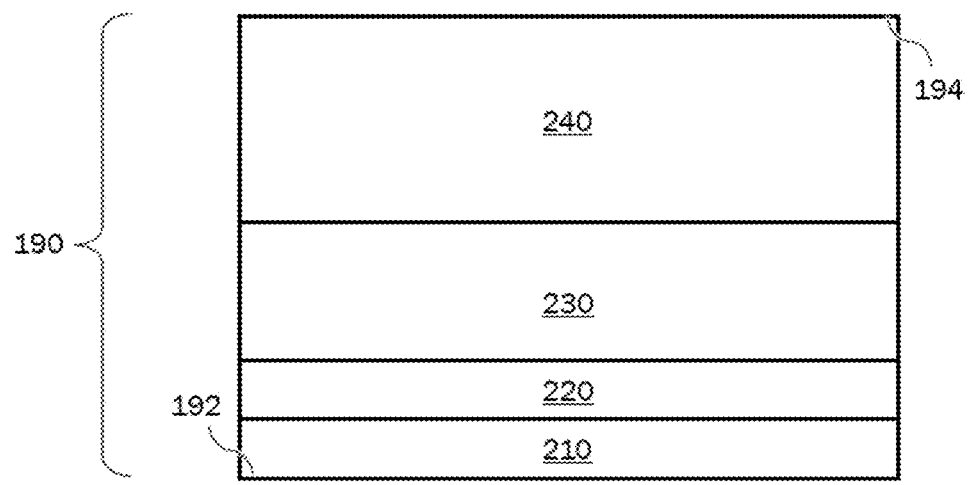
FIG. 2 schematically depicts a cross-sectional view of a first embodiment of a back contact layer of the photovoltaic device of FIG. 1.

FIG. 2 depicts an example conducting layer with four sublayers. In the example embodiment, a first sublayer or buffer sublayer 210 is contiguous with and defines the first surface 192 of the conducting layer 190, positioned over and adjacent to the HTL 180. A second sublayer or barrier sublayer 220 of the conducting layer 190 is positioned over and adjacent to the first sublayer 210. A third sublayer or conductor sublayer 230 of the conducting layer 190 is positioned over and adjacent to the second sublayer 220. A fourth sublayer or protective sublayer 240 is positioned over and adjacent to the third sublayer 230, and the protective sublayer 240 is contiguous with and defines the second surface 194 of the conducting layer 190.

Figure 3:
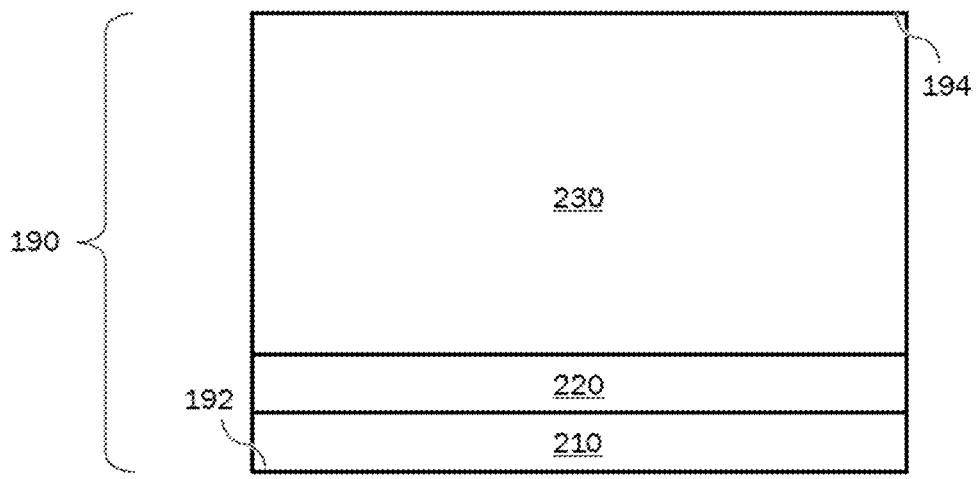
FIG. 3 schematically depicts a cross-sectional view of a second embodiment of a back contact layer of the photovoltaic device of FIG. 1.

FIG. 3 depicts an example conducting layer 190 with three sublayers. In the example embodiment, the structure of FIG. 3 is similar to the structure depicted in FIG. 2, but omits the protective fourth sublayer. In the device having a conducting layer 190 using the three-layer structure depicted in FIG. 3, the third sublayer 230 is contiguous with and defines the second surface 194 of the conducting layer 190.

A composition selected for the first sublayer or buffer sublayer 210 may have a high work function adapted to interface with the HTL. The composition selected for the first sublayer may be selected for deposition by processing steps that do not damage the underlying HTL or perovskite absorber. The composition selected for the first sublayer may be selected to protect the underlying HTL or perovskite absorber from subsequent processing steps.

In embodiments of the method, the first sublayer is formed adjacent to the second surface 184 of the HTL. In some embodiments, the first sublayer is deposited by thermal evaporation, in which the material of the first sublayer is deposited onto the second surface 184 of the HTL, and a temperature at the second surface 184 of the HTL does not exceed 150 C, or does not exceed 125 C.

A composition selected for the first sublayer 210 may be selected to provide a buffer and ohmic contact to the HTL. The first sublayer 210 may be selected to have a good work function and band gap alignment to the HTL. In some embodiments, the first sublayer has a work function greater than 5 eV. In some embodiments, the first sublayer has a work function in a range from 5 eV to 10 eV. In some embodiments, the first sublayer has a thickness in a range of 1-50 nm, or in a range of about 5-30 nm. In some embodiments, the first sublayer comprises a metal oxide or a metal oxynitride. In some embodiments, the first sublayer comprises a transition metal oxide. In some embodiments, the first sublayer comprises a transition metal oxide including at least one of: $WO_3$, $TiO_2$, $Cu_2O$, $MoO_3$, $V_2O_5$, or ZnO. In some embodiments, the first sublayer comprises at least one of: molybdenum oxide ($MoO_x$), bismuth telluride ($Bi_2Te_3$), vanadium oxide ($VO_x$), or tungsten oxide (WOO. In some embodiments, the first sublayer consists essentially of molybdenum oxide ($MoO_x$). In some embodiments, the first sublayer comprises at least one of: bismuth telluride ($Bi_2Te_3$), molybdenum tri-oxide ($MoO_3$), vanadium pent-oxide ($V_2O_5$), tungsten(III) oxide ($W_2O_3$), or tungsten(VI) oxide ($WO_3$).

A composition selected for the second sublayer 220 may be selected to provide a diffusion barrier. In some embodiments, the second sublayer 220 has a thickness in a range of 1-50 nm, in a range of 2-25 nm, in a range of 5-30 nm, in a range of 2-15 nm, or in a range of about 5-10 nm. In some embodiments, the second sublayer comprises a metal nitride or a metal oxynitride. In some embodiments, the second sublayer comprises at least one of: molybdenum nitride ($MoN_x$), aluminum oxide ($Al_2O_3$), silicon oxide ($SiO_2$), silicon oxynitride ($SiNO_x$), titanium nitride ($TiN_x$), chromium nitride ($CrN_x$), tin oxide ($SnO_x$), tin-gallium oxide (GaOSn), aluminum nitride (AlN), nickel nitride ($Ni_3N$), titanium nitride (TiN), tungsten nitride ($WN_x$) selenium nitride ($SeN_x$), tantalum nitride (TaN), vanadium nitride (VN), molybdenum oxynitride ($MoN_xO_y$), or zirconium oxynitride ($ZrO_xN_y$). In some embodiments, the second sublayer consists essentially of a diffusion barrier material selected from: molybdenum nitride ($MoN_x$), aluminum oxide ($Al_2O_3$), silicon oxide ($SiO_2$), silicon oxynitride ($SiNO_x$), titanium nitride ($TiN_x$), or chromium nitride ($CrN_x$). In some embodiments, the second sublayer consists essentially of molybdenum nitride ($MoN_x$).

In some embodiments, the third sublayer 230 has a thickness in a range of 100-2500 nm, in a range of about 300-1600 nm, or in a range of 200-1200 nm. In some embodiments, the conductive sublayer or third sublayer 230 comprises a conducting material such as a metal. In some embodiments, the third sublayer comprises a metal such as: aluminum, copper, silver, gold, nickel, titanium, palladium, chromium, molybdenum, gold, iron, tantalum, or alloys thereof. In some embodiments, the third sublayer 230 comprises a conducting material, such as graphite or a conductive polymer. In some embodiments, the third sublayer 230 comprises a conductive metal alloy. In some embodiments, the third sublayer 230 comprises aluminum. In some embodiments, the third sublayer 230 consists essentially of aluminum.

A composition selected for the fourth sublayer or protective sublayer 240 may be selected to provide a moisture and corrosion-resistant layer. In some embodiments, the fourth sublayer 240 of the conductive layer 190, has a thickness in a range of 50-1500 nm, or in a range of about 100-900 nm. In some embodiments, the protective sublayer 240 comprises at least one of chromium (Cr), nickel (Ni), or alloys thereof. In some embodiments, the fourth sublayer 240 comprises at least one of chromium (Cr), nickel (Ni), iron (Fe), tantalum (Ta), molybdenum (Mo), or alloys thereof. In some embodiments, the fourth sublayer 240 comprises a conductive metal alloy. In some embodiments, the fourth sublayer 240 consists essentially of chromium.

The back contact, p-type electrode, or conducting layer 190 comprises a plurality of sublayers including: the first sublayer or buffer sublayer 210, the second sublayer or barrier sublayer 220, the third sublayer or conductor sublayer 230; and optionally, the fourth sublayer or protective sublayer 240. In some embodiments, the conductive layer 190 has a total thickness in a range of between about 0.2 µm to about 10 µm such as, for example, between about 0.5 µm to about 5 µm in one embodiment, or between about 0.8 µm to about 3.5 µm in another embodiment (800-3500 nm).

As shown in FIG. 1, the photovoltaic device 100 can include a back support 196 configured to cooperate with the substrate 110 to form a housing for the one or more photovoltaic cells. The back support 196 can be disposed at the opposing side 104 of the photovoltaic device. As an example, as shown in FIG. 1, the back support 196 can be formed adjacent to the second surface 194 of the conducting layer 190. The back support 196 can include a suitable material, including, for example, glass. In some embodiments, an encapsulation layer can also function as the back support 196. In some embodiments, a backing material or coating may be interposed between the conducting layer 190 and back support 196.

The photovoltaic device 100 can optionally include one or more interlayers and/or one or more buffer layers. A buffer layer can be configured to provide an insulating layer between adjacent layers. The buffer layer may include material having higher resistivity than an adjacent layer, and may include, but is not limited to, intrinsic tin dioxide, zinc magnesium oxide (e.g., $Zn_{1-x}Mg_xO$), tin dioxide ($SnO_2$), silicon dioxide ($SiO_2$), aluminum oxide ($Al_2O_3$), aluminum nitride (AlN), zinc tin oxide, zinc oxide, tin silicon oxide, or combinations thereof. In some embodiments, the material of the buffer layer can be configured to substantially match the band gap of an adjacent semiconductor layer. The buffer layer may have a thickness, including, for example, more than about 10 nm in one embodiment, between about 10 nm and about 80 nm in another embodiment, or in a range of 15 nm to 60 nm (15-60 nm) in a further embodiment.

In some embodiments, selected layers, including a conducting layer, a HTL, a perovskite absorber, and an ETL, are included in a tandem device. In methods for forming a tandem device, the methods for forming the perovskite layer may include forming the perovskite layer over a contact layer of a substrate stack wherein the substrate stack comprises a cell stack and a tunnel junction.

In an example process flow for forming a photovoltaic device, a substrate stack is prepared. The substrate may be formed of a transparent support, such as glass, with an n-type transparent conducting material as an electrode layer over the substrate. An ETL or first contact layer is disposed over the electrode layer and the transparent support to form a substrate stack. Optionally, the substrate stack may further include a first scribe set, and one or more additional layers, such as a buffer layer, a high resistance layer, or an antireflective layer. The substrate stack may be cleaned. The substrate stack may be cleaned with a fluid, such as a solvent or a gas, or UV ozone, or a plasma. An absorber layer comprising a perovskite layer is formed on the substrate stack. The perovskite layer may be formed in one or more steps. For example, a metal halide may be deposited over the substrate stack and a perovskite precursor cation may then be contacted with the metal halide to form the perovskite material. A second contact layer, a HTL, having opposite polarity to the first contact layer, is formed over the absorber layer, and a conducting layer forms a p-type electrode over the HTL to produce a device layer stack. In embodiments of the method, the conducting layer is formed by sequential deposition of a plurality of sublayers.

A substrate stack, an intermediate structure for a perovskite photovoltaic device, and/or a layer stack may be annealed. An annealing process may include controlling temperature, humidity, pressure, reactant concentration, reactant exposure time, and heating duration. In some embodiments, one or more dopants may be incorporated during the annealing process. The perovskite layer may be passivated during formation or annealing of the perovskite absorber layer, for example by exposure to compounds containing a chlorine halide. The perovskite absorber layer may optionally be passivated after formation or annealing. A diffusion barrier or moisture barrier layer may be added. The substrate stack and layer stack may be scribed, for example by a laser. An encapsulation layer may be applied over the completed device layer stack. Bussing or other electrical connections and a back support may be added to the device layer stack.

Photovoltaic devices may contain several material layers deposited sequentially over a substrate. Steps for manufacturing a photovoltaic device may include sequentially disposing functional layers or layer precursors in a "stack" of layers through one or more deposition processes, including, but not limited to, spin coating, spray coating, slot coating, blade coating, dip coating, sputtering, evaporation, molecular beam deposition, pyrolysis, closed space sublimation (CSS), pulse laser deposition (PLD), chemical vapor deposition (CVD), electrochemical deposition (ECD), atomic layer deposition (ALD), or vapor transport deposition (VTD). The as-deposited layer or layer stack may be processed to modify characteristics using one or more methods, for example, by annealing, passivating, heating, vapor contact, or chemical treatment. Manufacturing of photovoltaic devices can further include the selective removal of portions of certain layers of the stack of layers, such as by scribing, to divide the photovoltaic device into a plurality of photovoltaic cells.

Figure 4:
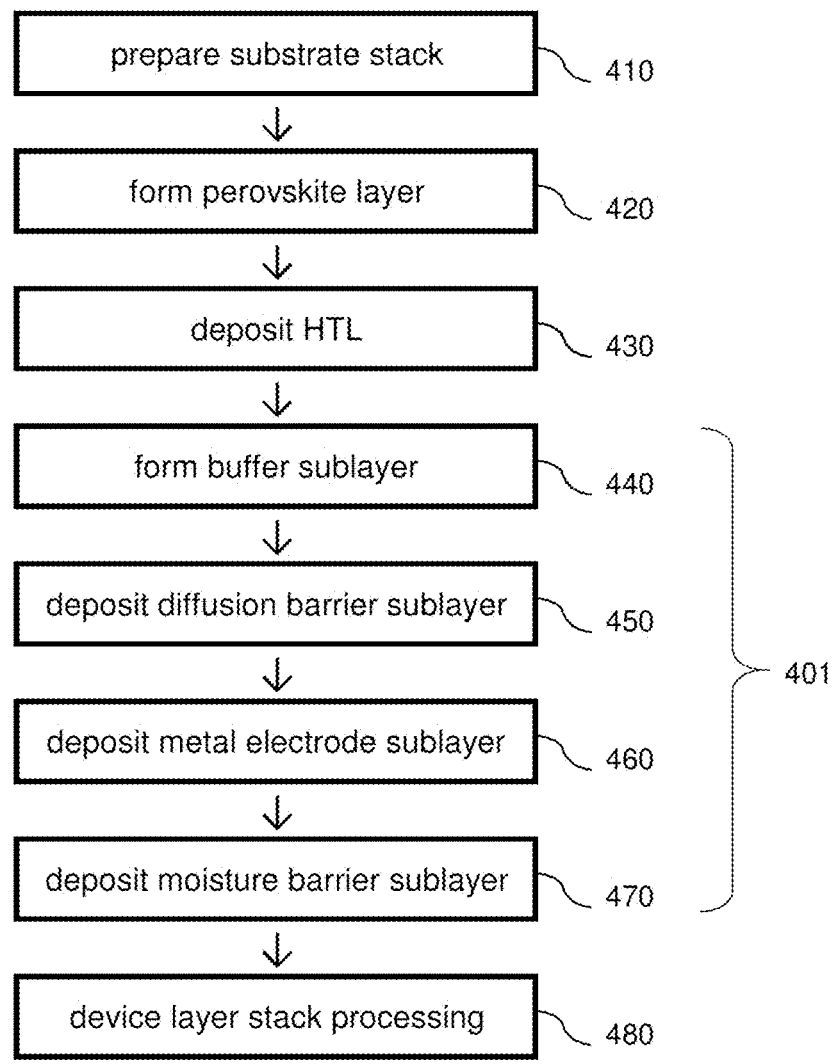
FIG. 4 shows a flow chart for an example method for making a photovoltaic device according to one or more embodiments shown and described herein.

Turning now to FIG. 4, an overview of an example process flow for forming a perovskite photovoltaic device with an N-I-P structure is described.

A method 400 for making a photovoltaic device may include preparing a substrate stack 410. Preparation of the substrate stack may include forming a transparent conducting layer or front contact over a substrate and forming an electron transport layer over the front contact. It may also, optionally, include formation of one or more buffer layers or barrier layers. Steps involved in preparing a substrate stack 410 may include deposition methods previously described, as well as heating steps and cleaning steps.

Forming the perovskite absorber layer 420 is performed after the step of preparing a substrate stack 410. There are various methods suitable for forming a perovskite absorber layer. In an example method, one or more BX materials, for example, lead iodide ($PbI_2$), is deposited in a contiguous BX layer on the substrate stack. One or more A-type cations or AX materials, for example, formamidinium iodide (FAI), is deposited over the BX layer. The intermediate structure of the substrate stack with the BX layer and A-type cation are subjected to heat treatment to react the metal halide and cation layers to form the perovskite absorber layer, for example a $FAPbI_3$ perovskite material. During heat treatment, controlled parameters may include: temperature, pressure, ambient gases, humidity, and treatment duration.

High sustained temperatures, for example, over about 200 C, for longer than about 1-2 minutes, are likely damage the perovskite material. To maintain absorber layer integrity, processing steps following the formation of the perovskite absorber are selected to not expose the intermediate structure, with the perovskite absorber layer, to high temperatures or other conditions that could cause damage. Both the perovskite material and, also, often the HTL material, are susceptible to damage from heat, moisture, etchants, and some solvents. Because of these limitations, many processes which are used with other types of photovoltaic devices, for example thin-film CdTe-type or CIGS-type devices, are not suitable for processing perovskite devices.

Forming the HTL 430 is performed after the step of forming the perovskite absorber layer 420. There are various methods suitable for forming a HTL, such as, for example, spray coating, spin coating, slot-die coating, sol-gel formation, and evaporation. In an example method, a layer of Spiro-OMeTAD is spray coated over the absorber layer and cured by heating at a temperature less than about 150 C at ambient pressure.

According to embodiments of the method, a multilayer back contact conducting layer is formed over the HTL. The process to form a back contact 401 includes: forming a buffer sublayer 440, forming a diffusion barrier sublayer 450, forming a metal electrode conductor sublayer 460, and, optionally, forming a moisture barrier or protective sublayer 470. After the multilayer back contact is formed, additional device processing 480 is performed to complete the device. Additional device processing steps may include applying a back support, making electrical connections, and encapsulating the device.

The formation of the buffer sublayer is accomplished using a perovskite-compatible process that does not require high temperature deposition steps, reactive etchants, or high-temperature annealing steps. Perovskite-compatible processes include processes that can be performed at temperatures below 200 C. For example, these may include physical vapor deposition (PVD) processes, molecular layer deposition, atomic layer deposition (ALD), sublimation, close-space sublimation (CSS), evaporation, flash evaporation, and wet techniques. Perovskite-compatible processes would not typically include processes such as sputtering. The presence of the buffer sublayer, facilitates using a broader set of deposition techniques, such as sputtering and some chemical vapor deposition (CVD) processes, in forming the subsequent layers.

The step of forming a buffer sublayer 440, or the first sublayer, may be performed by depositing a thin layer of a buffer material by a perovskite-compatible process, such as thermal evaporation, spray pyrolysis, closed space sublimation (CSS), chemical vapor deposition (CVD), atomic layer deposition (ALD), or a wet process, such as spin coating, spray coating, slot-die coating, inkjet printing, blade coating, roll coating, dip coating, or sol-gel. Preferably, the deposition method selected is suitable for forming a thin and substantially uniform sublayer of the selected buffer material.

The material of the buffer sublayer may be selected by characteristics including its work function relative to the HTL material or to the perovskite absorber, by its buffering qualities, its electrical properties, and by having a melting temperature low enough to form a thin, even layer on the HTL without damage to the HTL. The material selected for the buffer sublayer is selected and configured to successfully convey holes from the perovskite and HTL toward the conductor sublayer. In some embodiments, the material of the buffer sublayer is a p-type material with a valence band higher than the perovskite valence band. In some embodiments, the material of the buffer sublayer is a thin layer of an n-type material with a high work function, such as $MoO_3$. In an example formation step, the buffer sublayer is molybdenum trioxide ($MoO_3$), with the buffer sublayer formed by thermal evaporation at low power, such as less than 20%, in a vacuum chamber having a pressure less than 0.001 Torr, and the buffer sublayer is deposited over and adjacent to the HTL, at a thickness of about 10-30 nm. In another example, a buffer sublayer is deposited by a wet process and cured at a temperature in a range of 50° C. to 120° C. for a period of 10 to 120 minutes.

The step of forming a diffusion barrier sublayer 450, or the second sublayer, may be performed by depositing a thin layer of a barrier material onto the buffer sublayer 440. The material of the barrier sublayer may be selected by characteristics including its qualities as a diffusion barrier and its electrical properties. In an example formation step, the barrier sublayer is molybdenum nitride ($MoN_x$) deposited by sputtering adjacent to the buffer sublayer, at a thickness of about 5-15 nm.

The step of forming a conductor sublayer 460, the metal electrode sublayer, or the third sublayer, may be performed by depositing a conductive material over the barrier sublayer. The material of the conductor sublayer may be selected by characteristics including its conductive qualities. A wide range of conductive material may be selected because the presence of the buffer sublayer and the barrier sublayer, mitigates the propensity of ions from the conductive material to contact material from other layers of the device. The presence of an optional protective sublayer of the conducting layer, or the presence of an optional seal layer over the conducting layer, mitigates corrosion and moisture damage to the conductor sublayer, and allows the conducting material to be selected without regard for the propensity of the material to corrode. In an example formation step, the conducting sublayer is Aluminum (Al) deposited by sputtering adjacent to the barrier sublayer, at a thickness of about 100-500 nm.

The step of forming a protective sublayer 470, or the fourth sublayer, may be performed by depositing a protective material over the conductor sublayer. The protective material may be selected for qualities such as imperviousness to moisture vapor and liquids, resistance to cracking or fracturing, thermal tolerance, abrasion resistance, and other factors. In an example formation step, the protective sublayer is chromium (Cr) deposited by sputtering adjacent to the conducting sublayer, at a thickness of about 50-300 nm.

Without wishing to be bound by theory, it is believed that the sublayer combination provides reinforcing and synergistic benefits. The thin buffer sublayer can be formed by a low temperature process, and the presence of the buffer sublayer confers both chemical and thermal buffering, such that subsequent sublayers of the back contact can be deposited using processes that require exposure to higher temperatures, such as sputtering. Interdiffusion is curtailed and surface roughness may be mitigated. The buffer sublayer combined with the barrier sublayer prevented pin-holes and shunting defects, as well as contributing to long-term stability and good ohmic contact with low resistance. The combination of the buffer and barrier sublayers facilitates the use of a thinner layer of a conductive sublayer material, contributing to savings in materials and weight without reducing efficiency.

Figure 5:
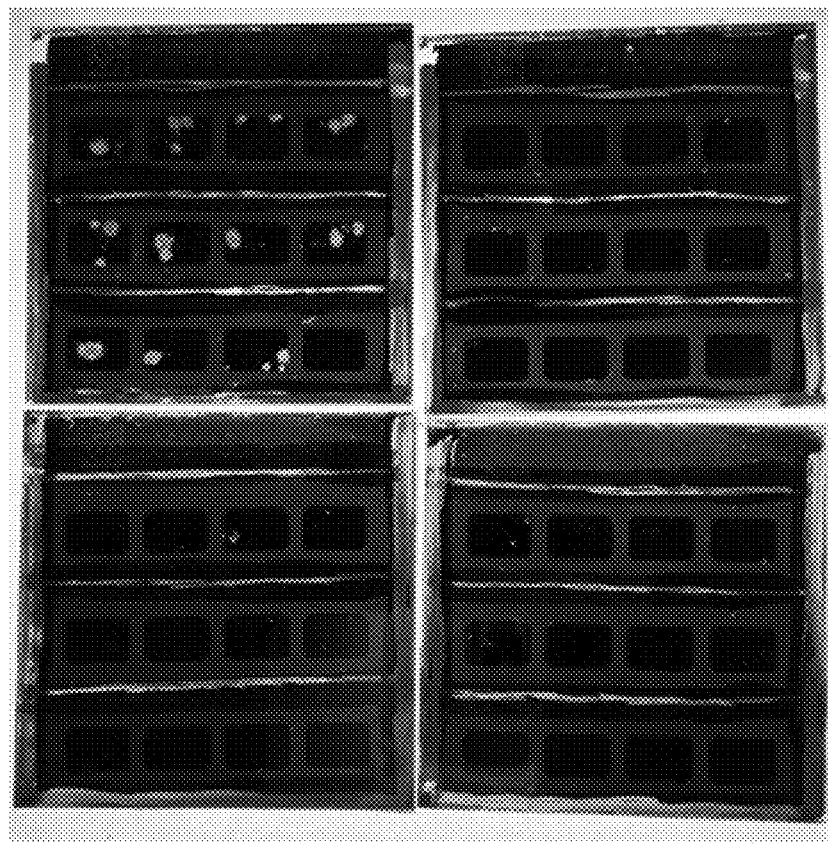
FIG. 5 shows a portion of a perovskite device with degradation.

FIG. 5 shows example structures formed with or without a molybdenum oxide (MOOR) buffer sublayer, with or without a molybdenum nitride ($MoN_x$) barrier sublayer, and with differing thickness, 5 nm or 10 nm, of the molybdenum nitride barrier sublayer. The upper left sample shows distinct pinholes formed in the sample with a molybdenum oxide buffer sublayer having an approximate thickness of 25 nm, but lacking a molybdenum nitride barrier sublayer.

Referring to FIGS. 6-13, a set of devices were prepared and device performance was compared. Control devices were prepared with a structure: glass/TC/lead-halide perovskite/PTAA/gold (Au). Measurements for the control are shown in the first column on the left for each of FIGS. 6-13. Measurements for experimental devices are shown in the second through fifth columns, in each instance having a structure like the control, but substituting for the gold back contact.

The device shown in the second column was prepared with the structure: glass/TC/lead-halide perovskite/PTAA/10 nm $MoN_x$/Al.

The device shown in the third column was prepared with the structure: glass/TC/lead-halide perovskite/PTAA/22 nm $MoO_x$/Al.

The device shown in the fourth column was prepared with the structure: glass/TC/lead-halide perovskite/PTAA/22 nm $MoO_x$/5 nm $MoN_x$/Al.

The device shown in the fifth column was prepared with the structure: glass/TC/lead-halide perovskite/PTAA/22 nm $MoO_x$/10 nm $MoN_x$/Al.

Figure 6:
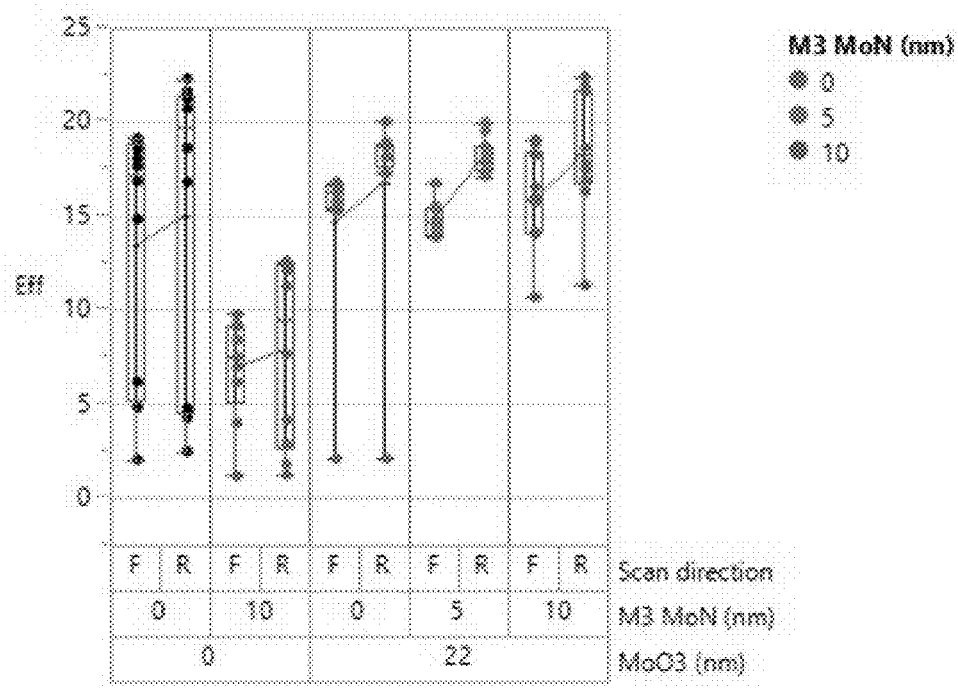
FIG. 6 shows a comparison of performance characteristics for measurements of efficiency for control devices and photovoltaic devices according to one or more embodiments shown and described herein.

FIG. 6 shows measurements of efficiency for control devices and photovoltaic devices as described above.

Figure 7:
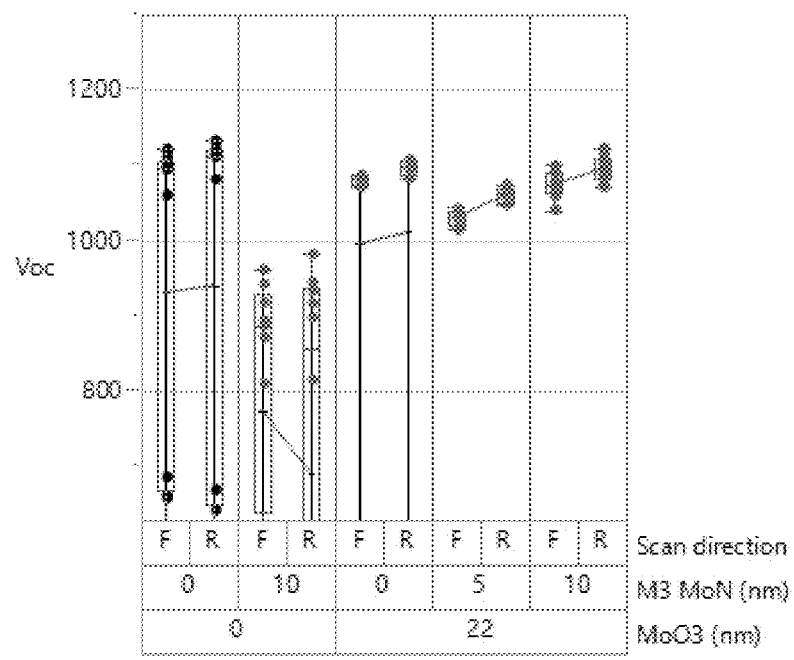
FIG. 7 shows a comparison of performance characteristics for open-circuit voltage ($V_{OC}$)

FIG. 7 shows open-circuit voltage ($V_{OC}$) measurements. High VOC values indicate good ohmic contact.

Figure 8:
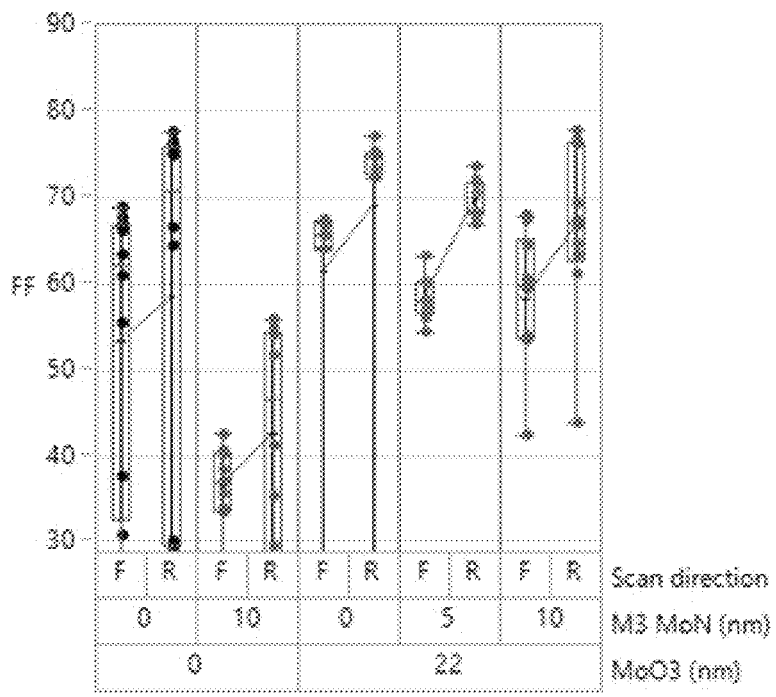
FIG. 8 shows a comparison of performance characteristics for fill factor (FF)

FIG. 8 shows a comparison of performance characteristics for fill factor (FF). Fill factor is largely influenced by resistance and conductivity. High fill factor values indicate good hole mobility and conductivity.

Figure 9:
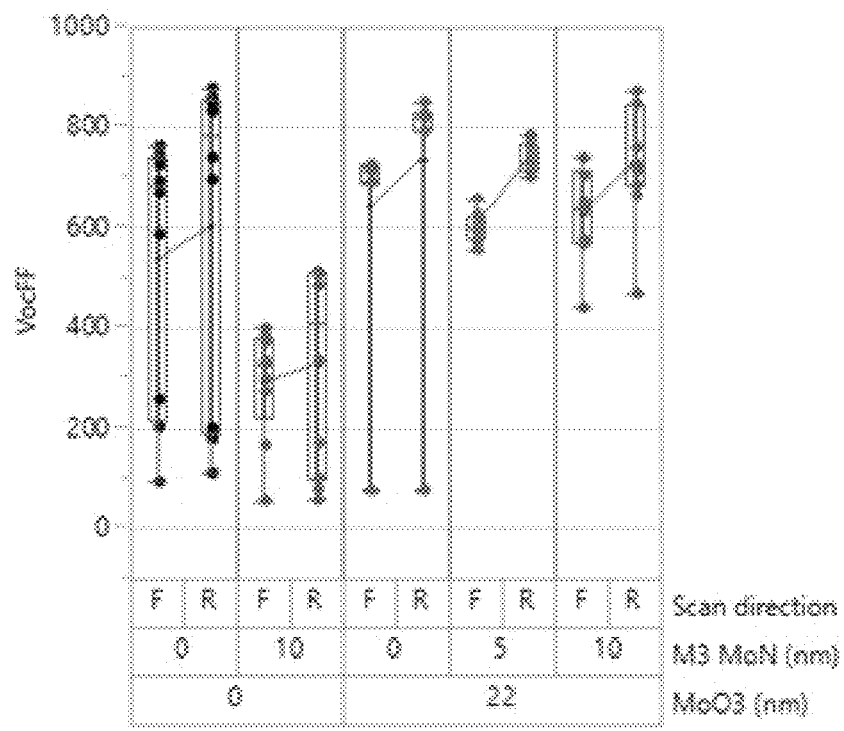
FIG. 9 shows a comparison of performance characteristics for ($V_{OC}$ FF)

FIG. 9 shows a comparison of performance characteristics for open-circuit voltage times fill factor ($V_{OC}$ FF).

Figure 10:
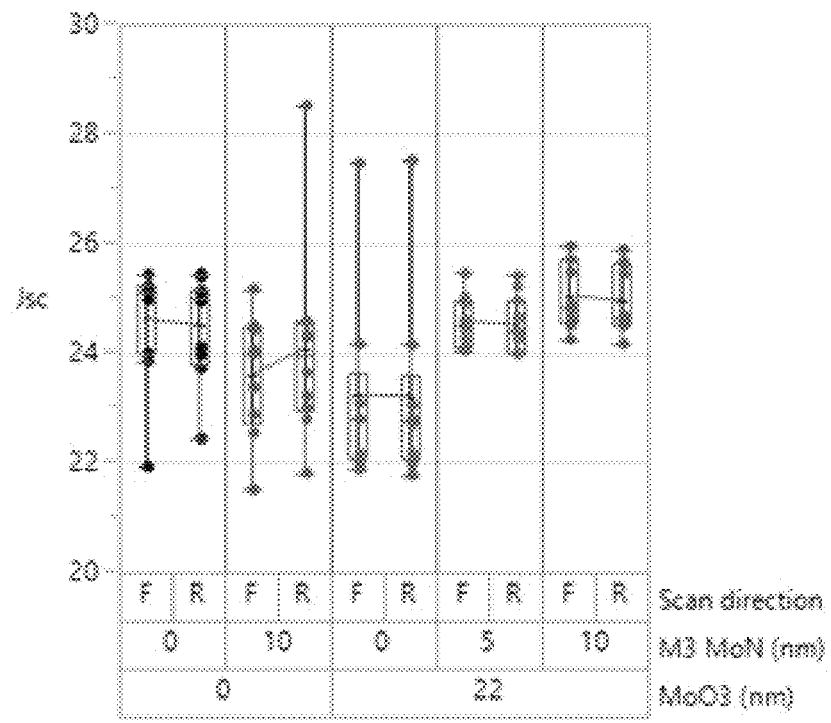
FIG. 10 shows a comparison of performance characteristics for short-circuit current density ($J_{SC}$)

FIG. 10 shows short-circuit current density (Jsc in mA/cm2) of comparative devices.

Figure 11:
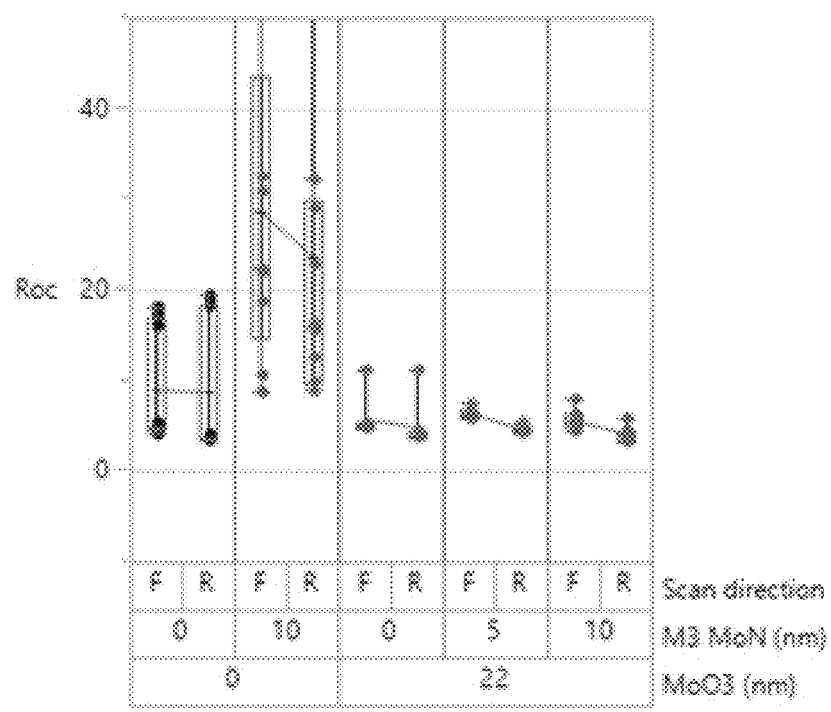
FIG. 11 shows a comparison of performance characteristics for open circuit resistance ($R_{OC}$)

FIG. 11 shows measurements of open circuit resistance ($R_{OC}$) for comparative devices. Molybdenum oxide layers are known to be resistive, which typically discourages use of $MoO_x$ layers as back contact materials for high-efficiency devices. However, when used as a thin sublayer, as in the described devices, its conductivity is sufficient, at that thinness, to not detrimentally affect $R_{OC}$.

Figure 12:
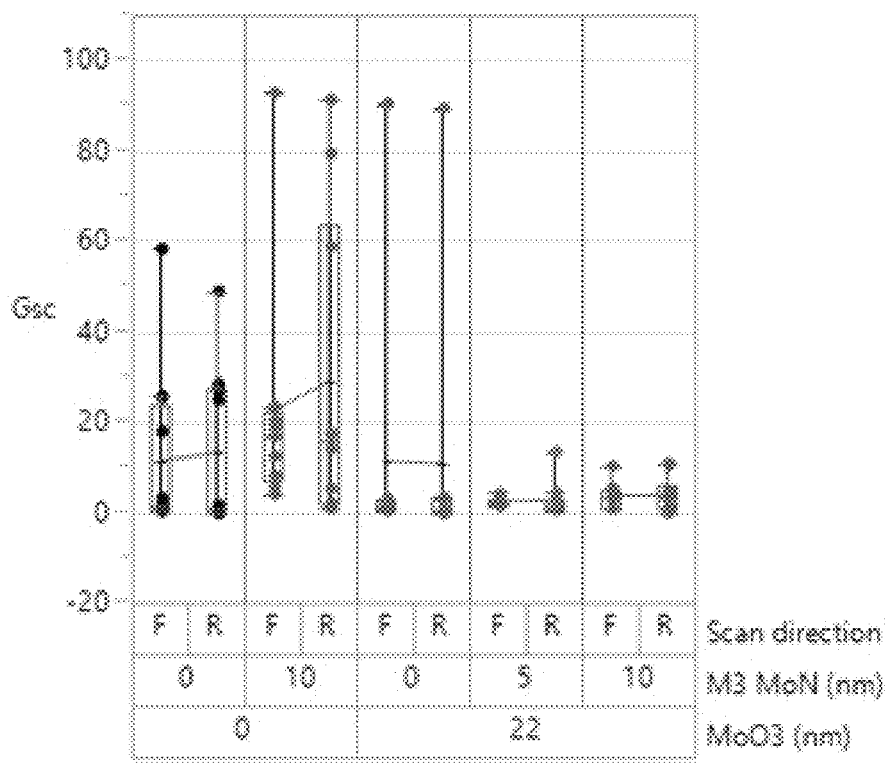
FIG. 12 shows a comparison of performance characteristics for short-circuit conductance ($G_{SC}$)

FIG. 12 shows a comparison of performance characteristics for short-circuit conductance ($G_{SC}$). Short-circuit conductance $G_{SC}$ is among the parameters used to evaluate photovoltaic device performance characteristics. The $G_{SC}$ is used to evaluate the amount of electrical loss caused by the device's shunt resistance. The greater the $G_{SC}$, the more shunted the device and the less power that the device can produce.

Figure 13:
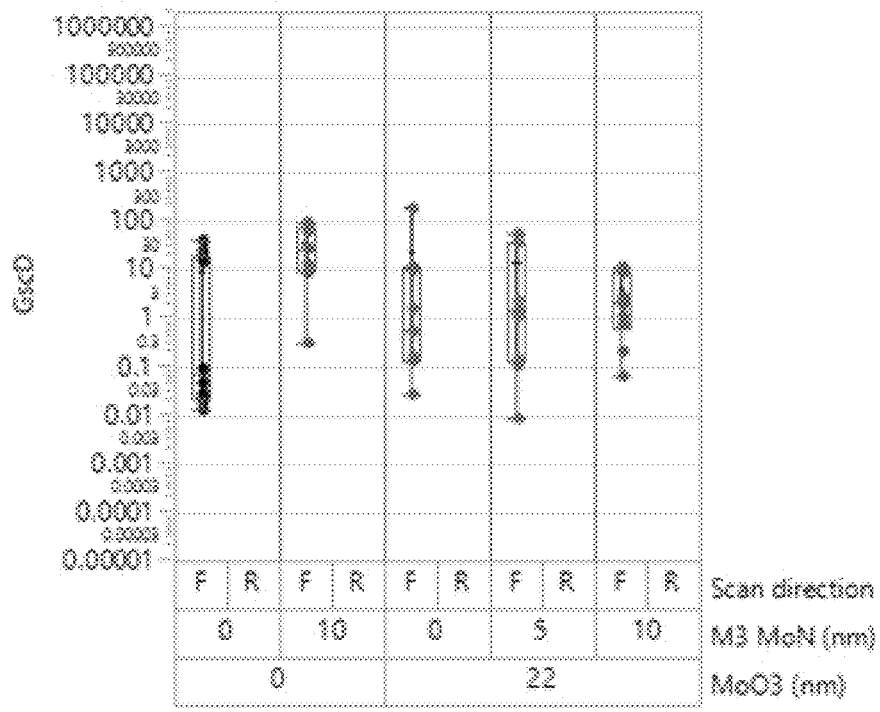
FIG. 13 shows a comparison of performance characteristics for flux density ($G_{SC}D$).

FIG. 13 shows a comparison of performance characteristics for flux density ($G_{SC}D$).

The comparative performance characteristics shown in FIGS. 6-13 and in the comparative testing results indicate that the tested experimental structures were efficacious. Good efficiency, high ohmic contact, low shunting, and good carrier concentration levels were observed. Notably, the structures with both a barrier sublayer and a buffer sublayer performed similar or superior to controls in multiple parameters.

In another example, experimental devices are prepared with permutations of thicknesses for the barrier and buffer sublayers within a range of 5-50 nm. In another example, experimental devices are prepared with differing HTL materials.

In an example, devices are prepared with the structures: glass/TC/ETL/perovskite/HTL/$MoO_x$/$MoN_x$/Al/Cr. The thickness of the MoOx layer is formed at thicknesses in a range of 5-25 nm, including thicknesses of about 5 nm, 5-10 nm, 10-15 nm, 5-15 nm, 10-20 nm, 10-25 nm, 15-25 nm, and 15-25 nm. This MoOx layer is combined into devices having a MoNx layer with a thicknesses in a range of 5-50 nm, including thicknesses of about 5 nm, 5-10 nm, 10-15 nm, 5-15 nm, 10-20 nm, 10-25 nm, 15-25 nm, 15-25 nm, 15-30 nm, 20-30 nm, 25-35 nm, 20-40 nm, 25-40 nm, 35-40 nm, 25-50 nm, 35-50 nm and 40-50 nm.

In an example, devices are prepared with the structures: glass/TC/ETL/perovskite/HTL/$Bi_2Te_3$/$MoN_x$/Al/Cr. The thickness of the $Bi_2Te_3$ layer is in a range of 5-25 nm and a MoNx layer has a thicknesses in a range of 5-50 nm.

In an example, devices are prepared with the structures: glass/TC/ETL/perovskite/HTL/$VO_x$/$MoN_x$/Al/Cr. The thickness of the $VO_x$ layer is in a range of 5-25 nm and a $MoN_x$ layer has a thicknesses in a range of 5-50 nm.

In an example, devices are prepared with the structures: glass/TC/ETL/perovskite/HTL/$MoO_x$/$MoN_xO_y$/Al/Cr. The thickness of the $MoO_x$ layer is in a range of 5-25 nm and a $MoN_xO_y$ layer has a thicknesses in a range of 5-50 nm.

In an example, devices are prepared with the structures: glass/TC/ETL/perovskite/HTL/$MoO_x$/$Al_2O_3$/Al/Cr. The thickness of the $MoO_x$ layer is in a range of 5-25 nm and a $Al_2O_3$ layer has a thicknesses in a range of 5-50 nm.

In an example, devices are prepared with the structures: glass/TC/ETL/perovskite/HTL/$MoO_x$/$SiO_2$/Al/Cr. The thickness of the $MoO_x$ layer is in a range of 5-25 nm and a $SiO_2$ layer has a thicknesses in a range of 5-50 nm.

In an example, devices are prepared with the structures: glass/TC/ETL/perovskite/HTL/$MoO_x$/$CrN_x$/Al/Cr. The thickness of the $MoO_x$ layer is in a range of 5-25 nm and a $CrN_x$ layer has a thicknesses in a range of 5-50 nm.

In some examples, the HTL comprises one of SpiroO-MeTAD, PTAA, P3HT-COOH, PEDOT:PSS, or P3HT.

In some examples, the third sublayer comprises aluminum. In some examples, the third sublayer is a metal sublayer. In some examples, the third sublayer is a sublayer of aluminum metal. In some examples, the third sublayer comprises copper. In some examples, the third sublayer is aluminum alloyed with copper.

In some examples, the fourth sublayer comprises chromium. In some examples, the fourth sublayer is a sublayer of chromium metal. In some examples, the fourth sublayer comprises nickel. In some examples, the fourth sublayer comprises chromium alloyed with nickel.

It should now be understood that the functional layers of the back contact layer can provide improved stability and reliability, while providing comparable functionality relative to known contact layers for perovskite-based devices. Accordingly, the embodiments provided herein can improve the utility of photovoltaic devices.

According to embodiments described herein, a photovoltaic device can include: a perovskite absorber layer, a hole transport layer over the perovskite absorber layer, and a back contact in contact with the hole transport material. The back contact may include: a conductor sublayer, comprising at least one metal; and a buffer sublayer.

In some embodiments, the buffer sublayer is deposited by evaporation adjacent to the hole transport layer. In some embodiments, the buffer sublayer is disposed between the hole transport layer and the conductor sublayer. In some embodiments, the buffer sublayer has a thickness less than 25 nm.

In some embodiments, the buffer sublayer has a work function in a range from 5 eV to 10 eV In some embodiments, the buffer sublayer and the hole transport layer have a work function difference greater than 1 eV. In some embodiments, the buffer sublayer and the hole transport layer have a work function difference less than 8 eV. In some embodiments, the buffer sublayer and the hole transport layer have a work function difference within a range of 2 to 8 eV. In some embodiments, the buffer sublayer and the hole transport layer have a work function difference within a range of 1 to 6 eV.

In some embodiments, the buffer sublayer comprises at least one of a metal oxide or a metal oxynitride.

In some embodiments, the buffer sublayer comprises at least one of: molybdenum oxide ($MoO_x$), bismuth telluride ($Bi_2Te_3$), vanadium oxide ($VO_x$), tungsten oxide (WOO), titanium oxide ($TiO_x$), copper oxide ($CuO_x$), or zinc oxide ($ZnO_x$).

In some embodiments, the buffer sublayer has a thickness of 0.5 nm to 25 nm in a contiguous film over the hole transport layer.

In some embodiments, the conductor sublayer is a metal layer, comprising aluminum, copper, or combinations thereof.

In some embodiments, the conductor sublayer has a thickness of 100-2000 nm.

In some embodiments, the photovoltaic device includes a barrier sublayer disposed between the buffer sublayer and the conductor sublayer.

In some embodiments, the barrier sublayer is adjacent to the buffer sublayer.

In some embodiments, the barrier sublayer has a thickness in a range of 1-50 nm.

In some embodiments, the barrier sublayer comprises at least one of: molybdenum nitride ($MoN_x$), aluminum oxide ($Al_2O_3$), silicon oxide ($SiO_2$), silicon oxynitride ($SiNO_x$), titanium nitride ($TiN_x$), chromium nitride ($CrN_x$), tin oxide ($SnO_x$), tin-gallium oxide (GaOSn), aluminum nitride (AlN), nickel nitride ($Ni_3N$), titanium nitride (TiN), tungsten nitride ($WN_x$), selenium nitride ($SeN_x$), tantalum nitride (TaN), vanadium nitride (VN), molybdenum oxynitride ($MoN_xO_y$), or zirconium oxynitride ($ZrO_xN_y$).

In some embodiments, the photovoltaic device includes a protective sublayer disposed over and adjacent to the conductor sublayer. In some embodiments, the protective sublayer has a thickness of 100-500 nm. In some embodiments, the protective sublayer comprises chromium.

In some embodiments, the hole transport layer comprises at least one of PTAA, P3HT, P3HT-COOH, PEDOT:PSS, TTF-1, SGT-407, SpiroOMeTAD, NiOx, CuSCN, or CuI.

According to embodiments described herein, a back contact layer for a perovskite photovoltaic device and a method for making it is provided. A perovskite photovoltaic device, may include a perovskite absorber layer and a hole transport layer. In some embodiments, the back contact includes a buffer sublayer disposed adjacent to the hole transport layer. In some embodiments, the buffer sublayer has a thickness in a range of 1-30 nm. In some embodiments, the buffer sublayer comprises a metal oxide or a metal oxynitride. In some embodiments, the back contact includes a barrier sublayer disposed adjacent to the buffer sublayer.

In some embodiments, the barrier sublayer has a thickness in a range of 5-50 nm.

In some embodiments, the barrier sublayer comprises a transition metal nitride or a metal oxynitride.

In some embodiments, the back contact includes a conductor sublayer disposed over the buffer sublayer. In some embodiments, the conductor sublayer has a thickness in a range of 100-3500 nm. In some embodiments, the conductor sublayer comprises at least one material selected from: aluminum, copper, or silver.

In some embodiments, the buffer sublayer has a thickness in a range of 5 nm to 25 nm. In some embodiments, the barrier sublayer has a thickness in a range of 5 nm to 25 nm.

In some embodiments, the back contact layer includes a protective sublayer. In some embodiments, the protective sublayer comprises at least one of chromium or nickel. In some embodiments, the protective sublayer is disposed over and adjacent to the conductor sublayer. In some embodiments, the protective sublayer has a thickness in a range of 50-2000 nm. In some embodiments, the protective sublayer has a thickness in a range of 80-1000 nm.

In some embodiments, the buffer sublayer comprises at least one of: molybdenum oxide, bismuth telluride, tungsten oxide or vanadium oxide.

In some embodiments, the buffer sublayer consists essentially of molybdenum oxide, bismuth telluride, tungsten oxide or vanadium oxide.

In some embodiments, the barrier sublayer comprises at least one of: molybdenum nitride, tin oxide, silicon oxide, silicon oxynitride, titanium nitride, or chromium nitride.

In some embodiments, the barrier sublayer consists essentially of molybdenum nitride, tin oxide, silicon oxide, silicon oxynitride, titanium nitride, or chromium nitride.

According to embodiments described herein, a method of making a photovoltaic device is provided and includes the steps of: forming an absorber layer over a substrate stack, wherein the absorber layer comprises a perovskite material; depositing a hole transport layer over the absorber layer; and forming a multilayer back contact layer by: depositing a buffer sublayer over the hole transport layer, wherein the depositing is performed at a temperature below 200 C;

depositing a barrier sublayer over the buffer sublayer; and depositing a conductor sublayer over the barrier layer.

In some embodiments, the step of depositing a buffer sublayer comprises thermal evaporation of at least one of: molybdenum oxide ($MoO_x$), bismuth telluride ($Bi_2Te_3$), vanadium oxide ($VO_x$), or tungsten oxide ($WO_x$).

In some embodiments, the step of depositing a buffer sublayer is performed by at least one of: thermal evaporation, spray pyrolysis, closed space sublimation (CSS), chemical vapor deposition (CVD), atomic layer deposition (ALD), spin coating, spray coating, slot-die coating, inkjet printing, blade coating, roll coating, dip coating, or sol-gel.

In some embodiments, one or both of the steps for depositing a barrier sublayer or a conductor sublayer is performed by sputtering.

In some embodiments, the step of depositing a barrier sublayer is performed by sputtering.

In some embodiments, the step of depositing a conductor sublayer is performed by sputtering.

In some embodiments, forming a multilayer back contact layer further comprises: depositing a protective sublayer comprising at least one of chromium or nickel over the conductor sublayer. In some embodiments, the step of depositing a protective sublayer is performed by sputtering.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A photovoltaic device comprising:
    a perovskite absorber layer,
    a hole transport layer over the perovskite absorber layer, and
    a back contact in contact with the hole transport material, wherein the back contact comprises:
    a conductor sublayer, comprising at least one metal;
    a barrier sublayer between the hole transport layer and the conductor sublayer, wherein the barrier sublayer comprises at least one of a transition metal nitride or a metal oxynitride; and
    a buffer sublayer,
    wherein the buffer sublayer is adjacent to the hole transport layer,
    the buffer sublayer comprises at least one of a metal oxide or a metal oxynitride;
    the buffer sublayer is disposed between the hole transport layer and the barrier sublayer;
    the buffer sublayer has a thickness less than 25 nm, and
    wherein the buffer sublayer and the barrier sublayer are made from different materials.

2. The photovoltaic device of claim 1, wherein the buffer sublayer has a work function in a range from 5 eV to 10 eV.

3. The photovoltaic device of claim 1, wherein:
    the buffer sublayer is deposited by evaporation; and
    the buffer sublayer comprises a metal oxynitride.

4. The photovoltaic device of claim 1, wherein the buffer sublayer comprises at least one of: molybdenum oxide ($MoO_x$), bismuth telluride ($BiTe_3$), vanadium oxide ($VO_x$), tungsten oxide ($WO_x$), titanium oxide ($TiO_x$), copper oxide ($CuO_x$), or zinc oxide ($ZnO_x$).

5. The photovoltaic device of claim 1, wherein the buffer sublayer has a thickness of 0.5 nm to 25 nm in a contiguous film over the hole transport layer.

6. The photovoltaic device of claim 1, wherein:
    the conductor sublayer is a metal layer, comprising aluminum, copper, or combinations thereof; and
    the conductor sublayer has a thickness of 100-2000 nm.

7. The photovoltaic device of claim 1, wherein:
    the barrier sublayer is adjacent to the buffer sublayer, and
    the barrier sublayer has a thickness in a range of 1-50 nm.

8. The photovoltaic device of claim 1, wherein:
    the barrier sublayer is adjacent to the buffer sublayer;
    the barrier sublayer has a thickness in a range of 1-50 nm; and
    the barrier sublayer comprises at least one of: molybdenum nitride ($MoN_x$), aluminum oxide ($Al_2O_3$), silicon oxide ($SiO_2$), silicon oxynitride ($SiNO_x$), titanium nitride ($TiN_x$), chromium nitride ($CrN_x$), tin oxide ($SnO_x$), tin-gallium oxide (GaOSn), aluminum nitride (AlN), nickel nitride ($Ni_3N$), titanium nitride (TiN), tungsten nitride ($WN_x$), selenium nitride ($SeN_x$), tantalum nitride (TaN), vanadium nitride (VN), molybdenum oxynitride ($MoN_xO_y$), or zirconium oxynitride ($ZrO_xN_y$).

9. The photovoltaic device of claim 1, further comprising a protective sublayer disposed over and adjacent to the conductor sublayer, wherein:
    the protective sublayer has a thickness of 100-500 nm; and
    the protective sublayer comprises chromium.

10. The photovoltaic device of claim 1, wherein the hole transport layer comprises at least one of PTAA, P3HT, P3HT-COOH, PEDOT: PSS, TTF-1, SGT-407, Spiro-OMeTAD, NiOx, CuSCN, or CuI.

11. A back contact for a perovskite photovoltaic device, having a perovskite absorber layer and a hole transport layer, the back contact comprising:
    a buffer sublayer disposed adjacent to the hole transport layer,
        wherein the buffer sublayer has a thickness in a range of 1-30 nm, and
        the buffer sublayer comprises a metal oxide or a metal oxynitride;
    a barrier sublayer disposed adjacent to the buffer sublayer,
        wherein the barrier sublayer has a thickness in a range of 5-50 nm, and
        the barrier sublayer comprises a transition metal nitride or a metal oxynitride; and
    a conductor sublayer disposed over the buffer sublayer,
        wherein the conductor sublayer has a thickness in a range of 100-3500 nm, and
        the conductor sublayer comprises at least one material selected from: aluminum, copper or silver,
    wherein the buffer sublayer and the barrier sublayer are made from different materials.

12. The back contact layer of claim 11, wherein the buffer sublayer has a thickness in a range of 5 nm to 25 nm, and the barrier sublayer has a thickness in a range of 5 nm to 25 nm.

13. The back contact layer of claim 11, further comprising a protective sublayer, wherein:
   the protective sublayer comprises at least one of chromium or nickel;
   the protective sublayer is disposed over and adjacent to the conductor sublayer; and
   the protective sublayer has a thickness in a range of 100-2000 nm.

14. The back contact layer of claim 11, wherein:
   the buffer sublayer comprises at least one of: molybdenum oxide, bismuth telluride, or vanadium oxide; and
   the barrier sublayer comprises at least one of: molybdenum nitride, tin oxide, silicon oxide, silicon oxynitride, titanium nitride, or chromium nitride.

15. The photovoltaic device of claim 1, wherein the hole transport layer comprises a carbazole-based self-assembled monolayer.

16. The photovoltaic device of claim 15, wherein the carbazole-based self-assembled monolayer comprises at least one of: 2PACz, MeO-2PACz, or Me-4PACz.

* * * * *